United States Patent
Sarshar et al.

(10) Patent No.: US 12,073,510 B2
(45) Date of Patent: Aug. 27, 2024

(54) THREE-DIMENSIONAL (3D) MODEL ASSEMBLY

(71) Applicant: NexTech AR Solutions Corp., Toronto (CA)

(72) Inventors: Nima Sarshar, Miami, FL (US); Max Hwang, Hayward, CA (US)

(73) Assignee: NexTech AR Solutions Corp., Toronto (CA)

( * ) Notice: Subject to any disclaimer, the term of this patent is extended or adjusted under 35 U.S.C. 154(b) by 123 days.

(21) Appl. No.: 17/707,917

(22) Filed: Mar. 29, 2022

(65) Prior Publication Data

US 2023/0079344 A1   Mar. 16, 2023

Related U.S. Application Data

(60) Provisional application No. 63/243,185, filed on Sep. 12, 2021.

(51) Int. Cl.
| | |
|---|---|
| *G06T 17/00* | (2006.01) |
| *G06F 30/10* | (2020.01) |
| *G06T 7/10* | (2017.01) |
| *G06T 7/62* | (2017.01) |
| *G06T 7/70* | (2017.01) |

(Continued)

(52) U.S. Cl.
CPC ............. *G06T 17/00* (2013.01); *G06F 30/10* (2020.01); *G06T 7/10* (2017.01); *G06T 7/62* (2017.01); *G06T 7/70* (2017.01); *G06T 7/90* (2017.01); *G06T 15/04* (2013.01); *G06T 17/10* (2013.01); *G06T 17/20* (2013.01); *G06T 17/30* (2013.01); *G06V 10/761* (2022.01); *G06V 20/64* (2022.01); *G06F 30/12* (2020.01); *G06N 20/20* (2019.01);

(Continued)

(58) Field of Classification Search
CPC .................................. G06T 17/00; G06T 7/10
See application file for complete search history.

(56) References Cited

U.S. PATENT DOCUMENTS

| | | |
|---|---|---|
| 6,239,808 B1 | 5/2001 | Kirk et al. |
| 6,591,158 B1 | 7/2003 | Bieterman et al. |

(Continued)

OTHER PUBLICATIONS

Peng, J. et al., "Interactive Modeling of Topologically Complex Geometric Detail," ACM SIGGRAPH 2004 Papers Aug. 1, 2004, pp. 635-643.

(Continued)

*Primary Examiner* — Michelle L Sams
(74) *Attorney, Agent, or Firm* — Fenwick & West LLP

(57) ABSTRACT

The model generation system may receive an object image and identify the parts of the object based on the object image. The model generation system may determine whether the model generation system has stored a part model that would correspond to the identified part. The model generation system may compare the portion of the object image that corresponds to the part to model images of a set of part models. The model generation system may identify a part model that best corresponds to the identified part based on similarity scores of the model images associated with the part model and the portion of the object image associated with the identified part. The model generation system may perform this process for each part of the object and then assemble an object model based on the part models for each part of the object.

20 Claims, 12 Drawing Sheets

(51) Int. Cl.
*G06T 7/90* (2017.01)
*G06T 15/04* (2011.01)
*G06T 17/10* (2006.01)
*G06T 17/20* (2006.01)
*G06T 17/30* (2006.01)
*G06V 10/74* (2022.01)
*G06V 20/64* (2022.01)
*G06F 30/12* (2020.01)
*G06N 20/20* (2019.01)

(52) U.S. Cl.
CPC ............ *G06T 2207/20044* (2013.01); *G06T 2207/20084* (2013.01); *G06T 2207/30196* (2013.01)

(56) References Cited

U.S. PATENT DOCUMENTS

| | | | |
|---|---|---|---|
| 9,424,461 B1* | 8/2016 | Yuan | G06V 20/647 |
| 10,679,046 B1 | 6/2020 | Black et al. | |
| 11,222,466 B1 | 1/2022 | Naruniec et al. | |
| 11,373,369 B2 | 6/2022 | Kemmler | |
| 2009/0058853 A1 | 3/2009 | Chang et al. | |
| 2009/0128556 A1 | 5/2009 | Fischer et al. | |
| 2010/0156901 A1 | 6/2010 | Park et al. | |
| 2012/0147152 A1* | 6/2012 | Vogiatis | G06T 7/50 |
| | | | 348/E13.021 |
| 2013/0083019 A1 | 4/2013 | Chang et al. | |
| 2015/0279085 A1 | 10/2015 | Dell | |
| 2017/0358119 A1 | 12/2017 | Forutanpour et al. | |
| 2019/0026958 A1* | 1/2019 | Gausebeck | H04N 13/10 |
| 2020/0234397 A1 | 7/2020 | Holzer et al. | |
| 2020/0349306 A1 | 11/2020 | Bruno et al. | |
| 2020/0372710 A1 | 11/2020 | Wang et al. | |
| 2021/0141983 A1 | 5/2021 | Kanamori et al. | |
| 2021/0201571 A1 | 7/2021 | State et al. | |
| 2021/0232120 A1 | 7/2021 | Marinov et al. | |
| 2022/0139057 A1 | 5/2022 | Choudhary et al. | |

OTHER PUBLICATIONS

Wang, H. et al., "Harmonic Parameterization by Electrostatics," ACM Transactions on Graphics, vol. 32, No. 5, Article 155, Sep. 2013, pp. 1-12.

Reinhard, E. et al. "Color Transfer Between Images." IEEE Computer Graphics and Applications, vol. 21, No. 5, Jul.-Aug. 2001, pp. 34-41.

U.S. Appl. No. 17/707,877, filed Mar. 29, 2022, Inventors Nima Sarshar and Max Hwang, (copy not enclosed).

U.S. Appl. No. 17/707,880, filed Mar. 29, 2022, Inventors Nima Sarshar and Max Hwang, (copy not enclosed).

U.S. Appl. No. 17/707,922, filed Mar. 29, 2022, Inventors Nima Sarshar and Max Hwang, (copy not enclosed).

Wei, L-Y. et al. "Fast Texture Synthesis Using Tree-Structured Vector Quantization." Proceedings of the 27th Annual Conference on Computer Graphics and Interactive Techniques, Jul. 2000, pp. 479-488.

United States Office Action, U.S. Appl. No. 17/707,877, filed Dec. 4, 2023, 29 pages.

United States Office Action, U.S. Appl. No. 17/707,880, filed Nov. 24, 2023, 10 pages.

* cited by examiner

THREE-DIMENSIONAL (3D) MODEL ASSEMBLY

CROSS REFERENCE TO RELATED APPLICATION

The present disclosure claims priority to U.S. Provisional Patent Application No. 63/243,185, entitled "Methods and Systems for Creating Optimized 3D Meshes from CAD Drawings" and filed on Sep. 12, 2021, which is hereby incorporated by reference.

BACKGROUND

Computing devices can display three-dimensional (3D) objects to a user through a digital 3D object model. These 3D object models may generally represent the structure of the object through the use of a meshes that is made up of a set of tessellations. There is a growing demand for 3D object models of real-life objects. For example, virtual reality and artificial reality systems generally use 3D object models to display virtual objects to users. Similarly, websites may use 3D object models to display objects that are available on those sites in a manner that allows a user to get a better sense of what the object looks like in 3D.

However, generating these meshes can conventionally be expensive and time consuming as it often requires a human to manually draw the 3D model of the object in a computer program. Some systems use depth sensors or laser scanners to generate a 3D model of an object by capturing data describing the object's structure from multiple angles. However, the equipment required to perform these scans can be expensive to purchase and use, and still requires a significant amount of time for each scan.

Additionally, 3D object models are generally rendered through the use of shaders. Shaders apply 2D texture maps to the 3D surface of a 3D object model. The texture maps describe how to display the surface of the 3D object model based on light conditions in the virtual environment in which the 3D object model is displayed. However, conventional methods for generating new texture maps for a color image of a physical material are also expensive and time consuming, given that they also generally require a human to manually create the set of texture maps that represent the physical material. Additionally, conventional systems are ineffective at applying 2D texture maps to 3D object models, and often stretch or tear the texture maps such that the 3D object models do not look realistic.

SUMMARY

A model generation system generates three-dimensional (3D) models for objects based on two-dimensional (2D) images of the objects. The model generation system may receive object images and generate a 3D object model for the object based on the object image. The model generation system may generate an object skeleton for the object based on the object image. The model generation system may use the object skeleton to generate pixel partitions representing parallel cross sections of the object. The model generation system may apply a machine-learning model (e.g., a neural network) to the object image to determine parameters for a shape that would best represent each parallel cross section and then generate the 3D object model for the object based on the shapes of each cross section, the object image, and the object skeleton.

By generating 3D models for objects based on 2D images, the model generation system improves on conventional technologies for generating 3D models for objects by reducing the time and cost required. Specifically, the model generation system may generate a 3D model of an object based on images of the object that are easy to capture, without specialized equipment or significant manual labor.

The model generation system also may generate texture maps for a texture based on a material image. A material image is an image of a physical material that describes the color (e.g., red-green-blue (RGB) color system model) of the physical material. The model generation system may identify a material class for the physical material depicted in the material image by applying a machine-learning model to the material image. The model generation system may then identify a texture map model that generates texture maps for the physical material based on the material image. The texture map model is a machine-learning model that is trained to generate texture maps for material images of a particular material class. The texture maps generated by the texture map model may include texture maps of standard texture values, such as metalness and roughness.

By generating texture maps based on a color image, the model generation system improves on conventional technologies for generating texture maps by reducing the time and cost required. Specifically, the model generation system is capable of generating a set of texture maps for a physical material without significant manual labor.

The model generation system also may assemble a 3D object model for an object based on part models for parts that make up the object. The model generation system may receive an object image and identify the parts of the object based on the object image. The model generation system may then determine whether the model generation system has stored a part model that would correspond to the identified part. The model generation system may compare the portion of the object image that corresponds to the part to model images of a set of part models. The model images are images of part models that are rendered based on different camera views of the part models. The model generation system may identify a part model that best corresponds to the identified part based on similarity scores of the model images associated with the part model and the portion of the object image associated with the identified part. The model generation system may perform this process for each part of the object and then assemble an object model based on the part models for each part of the object.

The model generation system improves on conventional model generation technologies by reusing previously generated part models for a new part corresponding to an object, thereby allowing high-quality 3D models to be reused more easily. Additionally, the model generation system more effectively identifies part models that can be used to represent a part of an object by using rendered model images from different perspectives, thereby ensuring that a match for the part can be more easily identified.

The model generation system also may generate a 3D object model based on computer aided design (CAD) data describing an object. The CAD data received by the CAD conversion module 160 may contain a set of surfaces for the object. Each surface may be described by a parameterized surface equation that describes the shape of the surface in a 3D space. The model generation system may extract those surface equations from the CAD data and generate field lines and equipotential lines for each surface. The field lines may be lines that are tangent to the gradient vector field of the surface, and the equipotential lines may be lines along the surface that designate points that have the same potential within the gradient field vector. The model generation system may use the field lines and the equipotential lines to generate quadrangular tessellations for a 3D object model for the object described by the CAD data.

The model generation system improves on conventional technologies through the use of heretofore unused information in CAD data for the effective generation of 3D models of objects and to apply a texture to the 3D model more effectively and efficiently. Additionally, by generating field lines and equipotential lines to use in the generation of a tessellated model, the model generation system can generate quadrangular tessellations that have edges that do not intersect while following the contours and edges of the surface itself, and have angles that are closer to right angles. These properties improve the overall quality of the tessellated 3D model.

DETAILED DESCRIPTION

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Example System Overview

Figure 1:
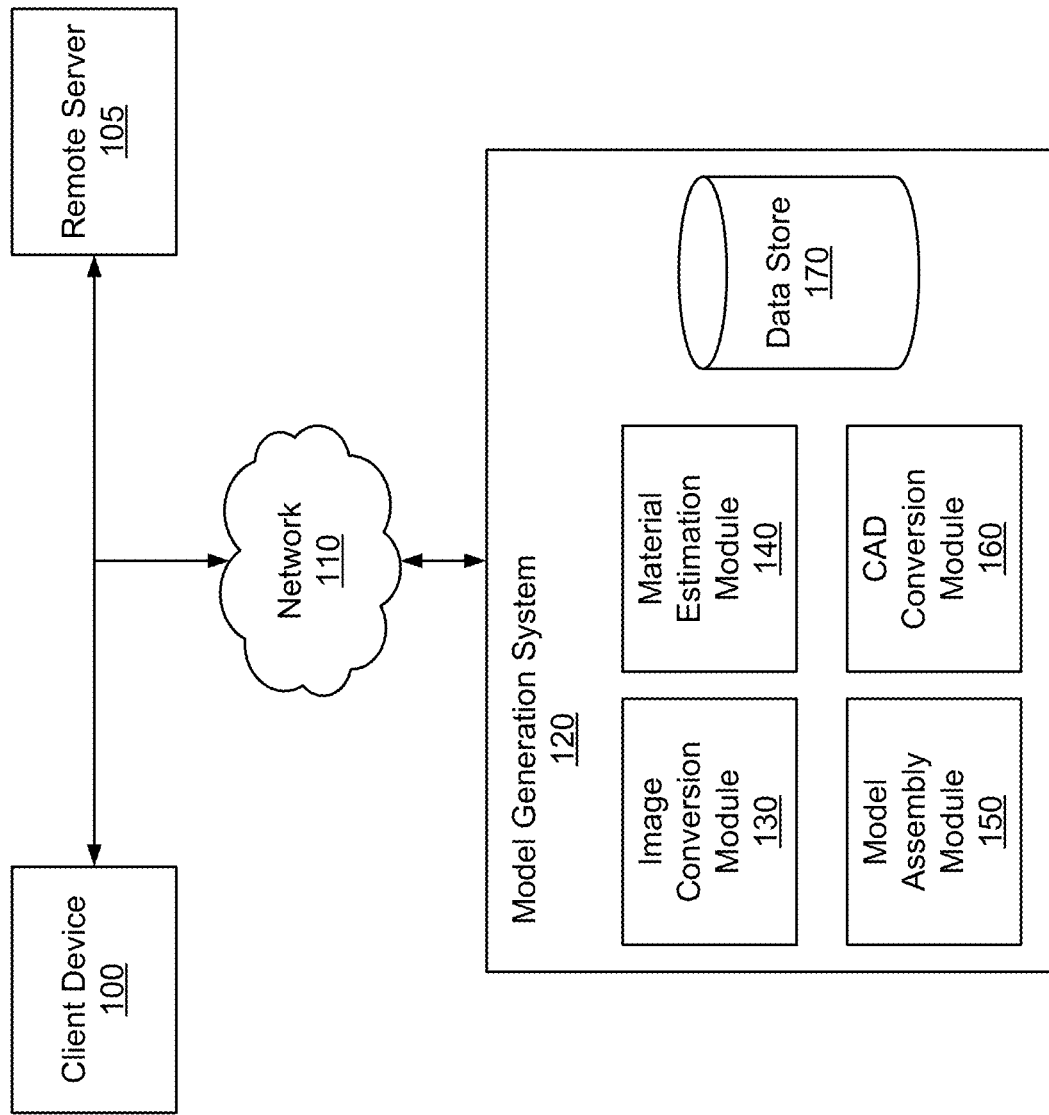
FIG. 1 illustrates an example system environment for a model generation system 120, in accordance with some embodiments.

FIG. 1 illustrates an example system environment for a model generation system 120, in accordance with some embodiments. The system environment illustrated in FIG. 1 includes one or more client devices 100, one or more remote servers 105, a network 110, and the model generation system 120. Alternative embodiments may include more, fewer, or different components from those illustrated in FIG. 1, and the functionality of each component may be divided between the components differently from the description below. Additionally, each component may perform their respective functionalities in response to a request from a human, or automatically without human intervention.

A user may interact with the model generation system 120 through a client device 100. The client device 100 can be a personal or mobile computing device, such as a smartphone, a tablet, a laptop computer, or desktop computer. In some embodiments, the client device 100 executes a client application that uses an application programming interface (API) to communicate with the online system 120 through the network 110.

The client device 100 may transmit image data of an object to the model generation system 120. The image data may include a two-dimensional (2D) object image that depicts an object in two-dimensional color pixel values. For example, a 2D object image may include a two-dimensional array of RGB values that depict the object. The client device 100 also may receive from the model generation system 120 a three-dimensional (3D) object model depicting an object. For example, the client device 100 may receive a 3D object model generated based on a 2D object image provided by the client device 100 or may receive a 3D object model requested by the user through the client device 100. In some embodiments, the client device 100 receives the 3D object model in an OBJ or a glTF file. The client device 100 may include a display by which the client device 100 can display a 3D object model to a user.

A remote server 105 may communicate with the model generation system 120 to generate 3D object models for 2D object images stored by the remote server 105. For example, the remote server 105 may store many 2D object images and the operator of the remote server 105 may want the model generation system 120 to generate 3D object models for the 2D object images. The remote server 105 may transmit 2D object images to the model generation system 120 and may receive 3D object models from the model generation system 120. In some embodiments, the remote server 105 provides 2D object images for objects available for sale on a website provided by the remote server 105.

The client device 100 and remote server 105 may communicate with the model generation system 120 via the network 110. The network 110 may comprise any combination of local area and wide area networks employing wired or wireless communication links. In some embodiments, the network 110 uses standard communications technologies and protocols. For example, the network 110 includes communication links using technologies such as Ethernet, 802.11, worldwide interoperability for microwave access (WiMAX), generational networks (e.g., 4G, 5G, 6G), code division multiple access (CDMA), digital subscriber line (DSL), etc. Examples of networking protocols used for communicating via the network 110 include multiprotocol label switching (MPLS), transmission control protocol/Internet protocol (TCP/IP), hypertext transport protocol (HTTP), simple mail transfer protocol (SMTP), and file transfer protocol (FTP). Data exchanged over the network 110 may be represented using any format, such as hypertext markup language (HTML) or extensible markup language (XML). In some embodiments, all or some of the communication links of the network 110 may be encrypted.

FIG. 1 also illustrates an example system architecture of a model generation system 120, in accordance with some embodiments. The model generation system 120 illustrated in FIG. 1 includes an image conversion module 130, a material estimation module 140, a model assembly module 150, a CAD conversion module 160, and a data store 170. Alternative embodiments may include more, fewer, or different components from those illustrated in FIG. 1, and the functionality of each component may be divided between the components differently from the description below. Additionally, each component may perform their respective functionalities in response to a request from a human, or automatically without human intervention. In addition, a module may be hardware based, e.g., a processor and a non-transitory memory, and/or software based. For example, the module may be a software program (e.g., computer code comprised of instructions) stored in the memory that when executed by the processor performs the described functionality.

Figure 2:
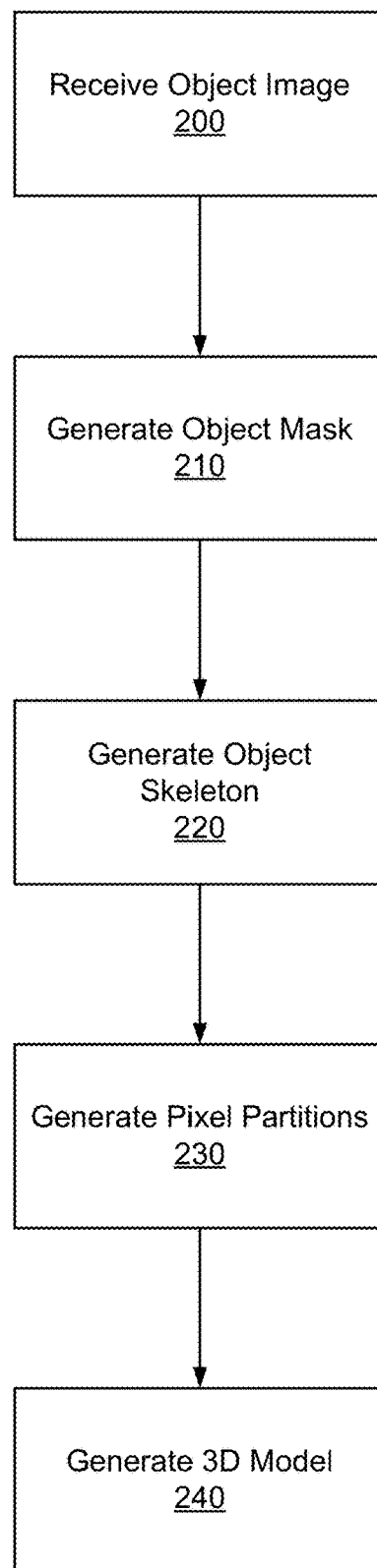
FIG. 2 is a flowchart for a method of generating a 3D object model based on a 2D object image, in accordance with some embodiments.

The image conversion module 130 receives object images from the client device 100, the remote server 105, or the data store 170 and generates a 3D object model for the object based on the object image. The image conversion module 130 may generate an object skeleton for the object based on the object image. The image conversion module 130 may use the object skeleton to generate pixel partitions representing parallel cross sections of the object. The image conversion module 130 may apply a machine-learning model (e.g., a neural network) to the object image to determine parameters for a shape that would best represent each parallel cross section and then generate the 3D object model for the object based on the shapes of each cross section, the object image, and the object skeleton. FIG. 2 and its corresponding description provide additional details on how 3D object models may be generated based on object images, in accordance with some embodiments.

Figure 4:
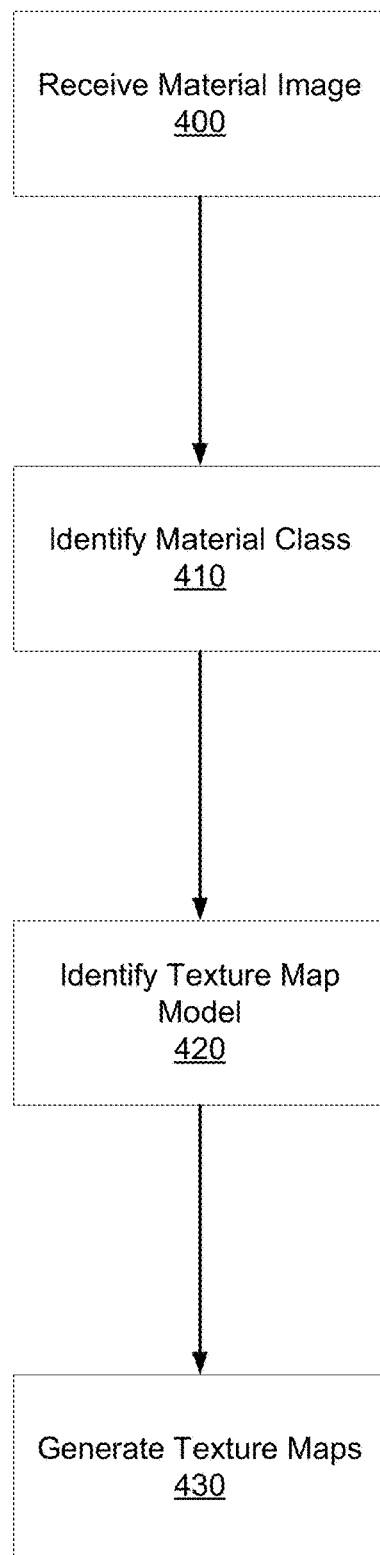
FIG. 4 is a flowchart for a method of generating texture maps based on material images, in accordance with some embodiments.

The material estimation module 140 generates texture maps for a texture based on a material image. A material image is an image of a physical material that describes the color (e.g., via an RGB color system) of the physical material. The material estimation module 140 may identify a material class for the physical material depicted in the material image by applying a machine-learning model to the material image. The material estimation module 140 may then identify a texture map model that generates texture maps for the physical material based on the material image. The texture map model is a machine-learning model that is trained to generate texture maps for material images of a particular material class. The texture maps generated by the texture map model may include texture maps of standard texture values, such as metalness and roughness. FIG. 4 and its corresponding description provide additional details on texture maps may be generated based on material images, in accordance with some embodiments.

Figure 6:
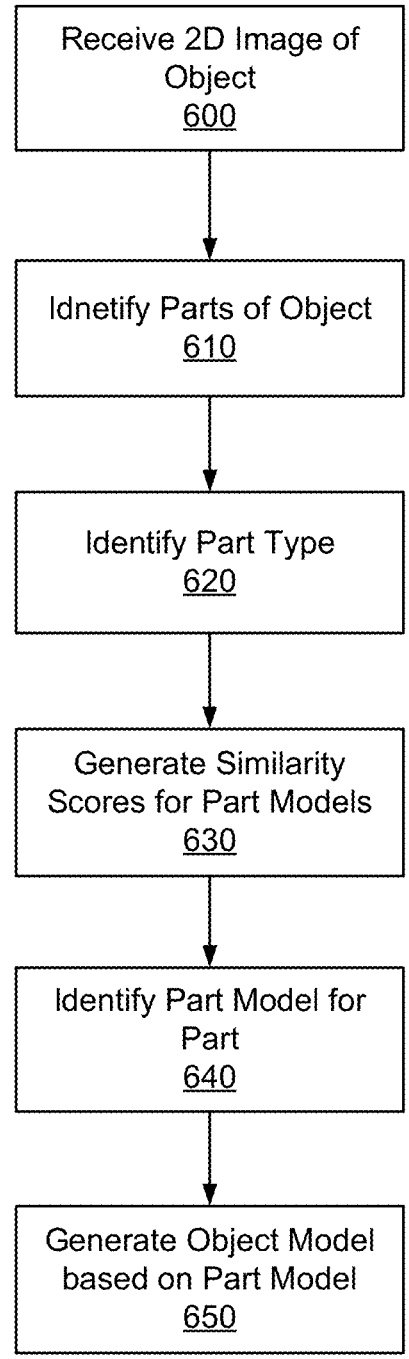
FIG. 6 is a flowchart for a method of assembling an object model based on a set of part models, in accordance with some embodiments.

The model assembly module 150 assembles a 3D object model for an object based on part models for parts that make up the object. The model assembly module 150 may receive an object image and identify the parts of the object based on the object image. The model assembly module 150 may then determine whether the model generation system 120 has stored a part model that would correspond to the identified part. The model assembly module 150 may compare the portion of the object image that corresponds to the part to model images of a set of part models. The model images are images of part models that are rendered based on different camera views of the part models. The model assembly module 150 may identify a part model that best corresponds to the identified part based on similarity scores of the model images associated with the part model and the portion of the object image associated with the identified part. The model assembly module 150 may perform this process for each part of the object and then assemble an object model based on the part models for each part of the object. FIG. 6 and its corresponding description explains more details on identifying part models and assembling object models, in accordance with some embodiments.

Figure 8:
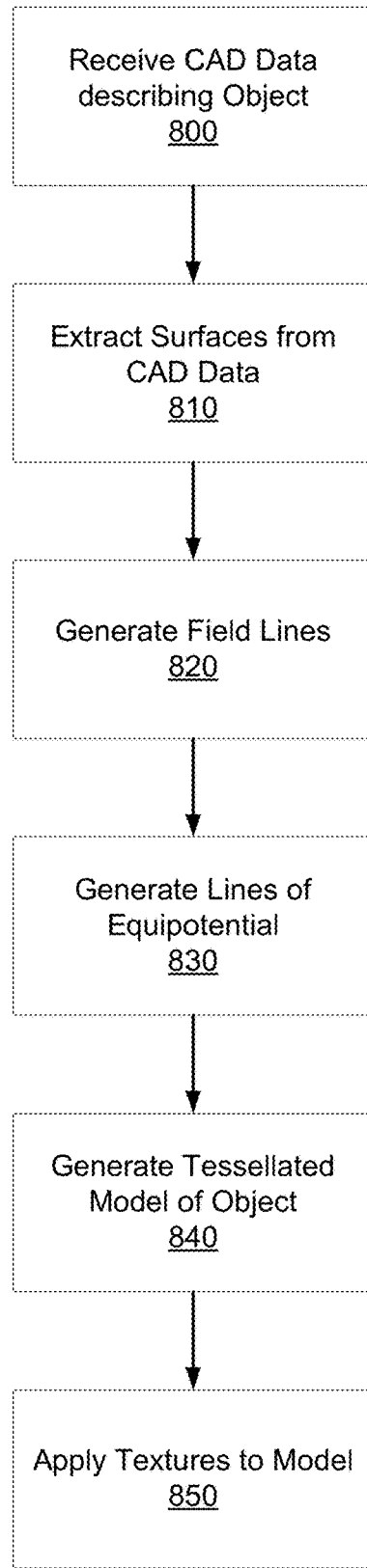
FIG. 8 is a flowchart for a method of generating 3D models of an object based on CAD data, in accordance with some embodiments.

The CAD conversion module 160 generates a 3D object model based on CAD data describing an object. The CAD data received by the CAD conversion module 160 may contain a set of surfaces for the object. Each surface may be described by a parameterized surface equation that describes the shape of the surface in a 3D space. The CAD conversion module 160 may extract those surface equations from the CAD data and generate field lines and equipotential lines for each surface. The field lines may be lines that are tangent to the gradient vector field of the surface, and the equipotential lines may be lines along the surface that designate points that have the same potential within the gradient field vector. The CAD conversion module 160 may use the field lines and the equipotential lines to generate quadrangular tessellations for a 3D object model for the object described by the CAD data. FIG. 8 and its corresponding description explains more details on generating 3D models based on CAD data, in accordance with some embodiments.

The data store 170 stores data used by the model generation system 120 to generate 3D models. For example, the data store 170 may store machine-learning models used by the model generation system 120 or may store the 3D models generated by the model generation system. Additionally, the data store 170 may store image data of objects that the model generation system uses to generate 3D models. In some embodiments, the data store 170 stores texture maps and material images used by the model generation system 120 to generate texture maps. Additionally, the data store 170 may store part models for parts of objects.

Example Image Conversion

Referring now to FIG. 2, illustrated is a flowchart for a method of generating a 3D object model based on a 2D object image, in accordance with some embodiments. Alternative embodiments may include more, fewer, or different steps from those illustrated in FIG. 2, and the steps may be performed in a different order from that illustrated in FIG. 2. Additionally, each of these steps may be performed automatically by the model generation system without human intervention. The method depicted in FIG. 2 may be performed by the image conversion module 130, or by some other component of the model generation system 120

The image conversion module 130 receives 200 a two-dimensional (2D) object image of an object. The object image may include a 2D array of pixels that describe the image. The pixels may describe color data (e.g., RGB) for the object image. Similarly, the pixels in the object image may include additional data, such as depth data. The object image may include some metadata describing the object. For example, the object image may include metadata identifying a type or class of the object depicted by the object image.

The image conversion module 130 generates 210 an object mask for the object image. An object mask is a pixel mask that filters out pixels in the object image that do not correspond to the object. Thus, by applying the object mask to the object image, the image conversion module 130 can filter out additional information in the object image that does not represent the object. The image conversion module 130 may generate the object mask by applying an object detection algorithm to the object image. The image conversion module 130 also may apply a machine-learning model (e.g., a neural network) that is trained to generate pixel masks for object images.

The image conversion module 130 generates 220 an object skeleton for the object depicted in the object image. An object skeleton is a set of pixels that correspond to axes of symmetry within the object. The object skeleton can thereby represent a general structure of the object.

The image conversion module 130 may generate the object skeleton by applying a distance function to pixels in the object mask. A distance function is a function that identifies the closest border pixel to a pixel in the object mask. A border pixel is a pixel in the object mask that is at the border between the object and the background. To generate the object skeleton, the image conversion module 130 identifies pixels in the object mask for which the distance function identifies two closest border pixels. That is, the image conversion module 130 identifies pixels that are equidistant to more than one closest border pixel. The image conversion module 130 uses these identified pixels as the object skeleton.

The image conversion module 130 generates 230 pixel partitions based on the object image, the object mask, and the object skeleton. A pixel partition is a set of pixels that corresponds to a cross-section through the object. The cross sections corresponding to the pixel partitions may be flat, parallel cross sections that together make up the object. The image conversion module 130 may generate a pixel partition for each pixel in the object skeleton. For example, the image conversion module 130 may identify, for each pixel in the object skeleton, the closest border pixels for the object skeleton pixel. The image conversion module 130 may determine all other pixels in the object mask for which those identified border pixels are also the closest border pixels. The image conversion module 130 may thereby generate as a pixel partition those pixels that correspond to the same border pixels as a pixel in the object skeleton.

Figure 3:
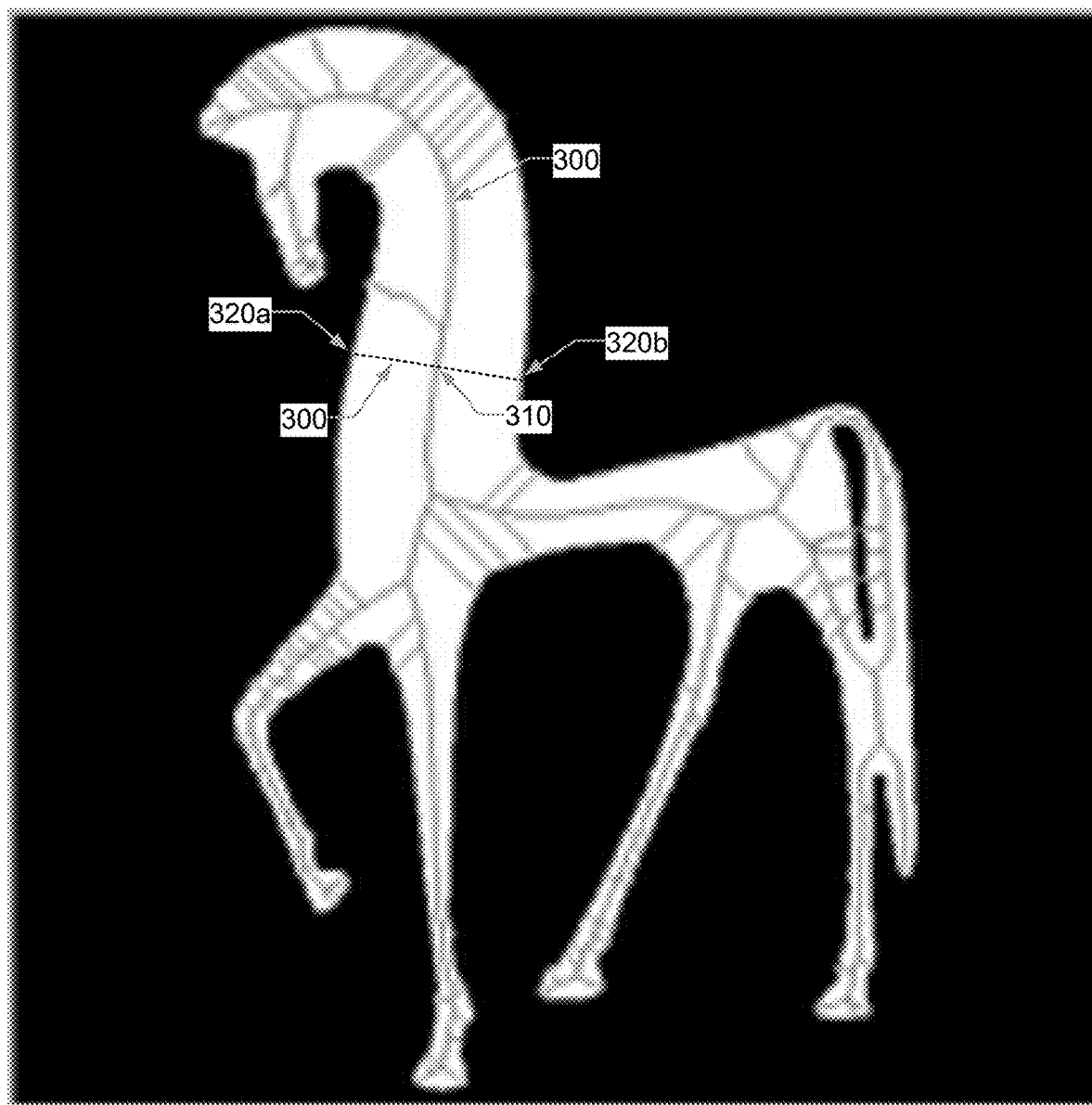
FIG. 3 illustrates an example object skeleton for a horse figurine, in accordance with some embodiments.

FIG. 3 illustrates an example object skeleton for a horse figurine, in accordance with some embodiments. The object skeleton 300 identifies the set of pixels in the object image that have two closest border pixels. For example, pixel 310 in the object skeleton 300 may have two closest border pixels: pixel 320*a* and 320*b*. The pixel partition 330 corresponding to pixel 310 are the set of pixels that have a closest border pixel of pixel 320*a* or pixel 320*b*. The pixel partition 330 is represented by the dotted line across pixels that may be included in the pixel partition 330.

The image conversion module 130 generates 240 a 3D model for the object based on the pixel partitions, the object mask, and the object image. To generate the 3D model, the image conversion module 130 may generate a shape that corresponds to each pixel partition. For example, the image conversion module 130 may generate a circle for each pixel partition. The image conversion module 130 may determine the width of each circle based on a distance between the border pixels in the pixel partition. It also may determine a location for the center of the circle based on the location of the object skeleton pixel in the pixel partition. The image conversion module 130 may stack these circles together to generate the 3D model for the object.

In some embodiments, the image conversion module 130 determines a shape to use for a pixel partition. For example, the image conversion module 130 may be capable of generating a square, rectangle, trapezoid, circle, triangle, pentagon, hexagon, or octagon for a pixel partition. The image conversion module 130 may determine which shape to use for a pixel partition, and then may determine parameters for the shape based on the pixels in the pixel partition. In some embodiments, the image conversion module 130 uses a classifier machine-learning model to predict which shape would best represent the portion of the object that the shape would represent. The image conversion module 130 may use another machine-learning model to determine the parameters for the shape (e.g., shape determination model). The image conversion module 130 may predict the shape or parameters for the shape based on the object image (including metadata possibly included with the object image), the object mask, or the pixels in the pixel partition.

The image conversion module 130 generates the 3D model for the object based on the shapes generated for each pixel partition. The image conversion module 130 may stack the shapes together to create the 3D model based on the position of the corresponding pixel in the object skeleton. The image conversion module 130 also may adjust the shapes based on adjacent shapes generated for the object. For example, the image conversion module 130 may adjust the parameters of a shape to make it more similar in size to an adjacent shape, or such that faces of the shape align more closely between shapes.

In some embodiments, the image conversion module 130 estimates a tilt of the object image to generate a 3D model of the object. The tilt of the object image is an angle between an axis of symmetry of the object and the direction at which the object image was captured. If the angle is not a right angle (i.e., 90 degrees), then the object image has a tilt. The image conversion module 130 may estimate the tilt of the object image by applying a machine-learning model to the object image that is trained to determine the tilt of an object image. The image conversion module 130 may then use the estimated tilt of the object image to generate the 3D model of the object. For example, if a shape generated for a pixel partition is positioned based on an axis of symmetry of the object, then the image conversion module 130 may use the estimated tilt of the object image to adjust the position of the generated shape or to determine which pixels of the object image should be used to generate the shape.

Example Texture Map Generation

FIG. 4 is a flowchart for a method of generating texture maps based on material images, in accordance with some embodiments. Alternative embodiments may include more, fewer, or different steps from those illustrated in FIG. 4, and the steps may be performed in a different order from that illustrated in FIG. 4. Additionally, each of these steps may be performed automatically by the model generation system without human intervention. The method depicted by FIG. 4 may be performed by the material estimation module 140 or some other component of the model generation system 120.

The material estimation module 140 receives 400 a material image of a physical material. The material image may be a 2D color image of the physical material captured by a camera or some other sensor. The material image may include a 2D array of pixels that represent color values for a section of the physical material.

The material estimation module 140 identifies 410 a material class for the material based on the material image. A material class is a type or class of material. Example material classes may include a macro material class, e.g., metals, wood, stone, soil, ceramics (including glass), plastics (including polymers), textiles, leathers (including synthetic leathers), rubbers, plant matter, and composites. Alternately, or in addition, material classes may include material refined materials classes. For example, metals may include metal such as tin, nickel, gold, or iron. In another example, soil may include mud or clay. In yet another example, plant matter may include paper, boxboard, or thatch. Still another example, textiles may include wool or linen. Moreover, the refined materials may reflect additional property characteristics that may be visible. For example, textiles may be further subclassified based on specifically weaved patterns, ceramics may be subclassified based on transparency, stone may be subclassified based on structure and/or appearance, wood may be subclassified based on grain, and metals based subclassified based on luster.

The material estimation module 140 identifies a material class for the material by applying a material classifier to the material image. A material classifier is a machine-learning model (e.g., a neural network) that is trained to predict material classes for a material image. In some embodiments, the material classifier generates class scores representing likelihoods that the material in the material image is a corresponding material class. For example, the material classifier may generate a first class score representing the likelihood that the material in the material image is in the plastic material class and a second class score representing the likelihood that the material is in the stone material class. The material estimation module 140 may identify the material class for the material based on the class score for each of material class. For example, the material estimation module 140 may identify the material class for the material image based on which material class has the highest class score.

The material estimation module 140 identifies 420 a texture map model for the material image based on the material class for the image. A texture map model is a machine-learning model (e.g., a neural network) that is trained to generate a set of texture maps based on a material images of a corresponding material class. A texture map is a 2D mapping of texture values to the 2D array of color values of the material image that indicates a texture value for the display of each pixel in the material image. Each texture map may represent a different parameter for the presentation of the physical material as a texture for a model of an object. For example, the texture map model may generate a texture map for one or more of the following texture parameters: metalness, specular, albedo, anisotropic, roughness, displacement, bumpiness, subsurface scattering, translucency, clear coat, ambient occlusion, cavity, transparency, and emission.

Figure 5A:
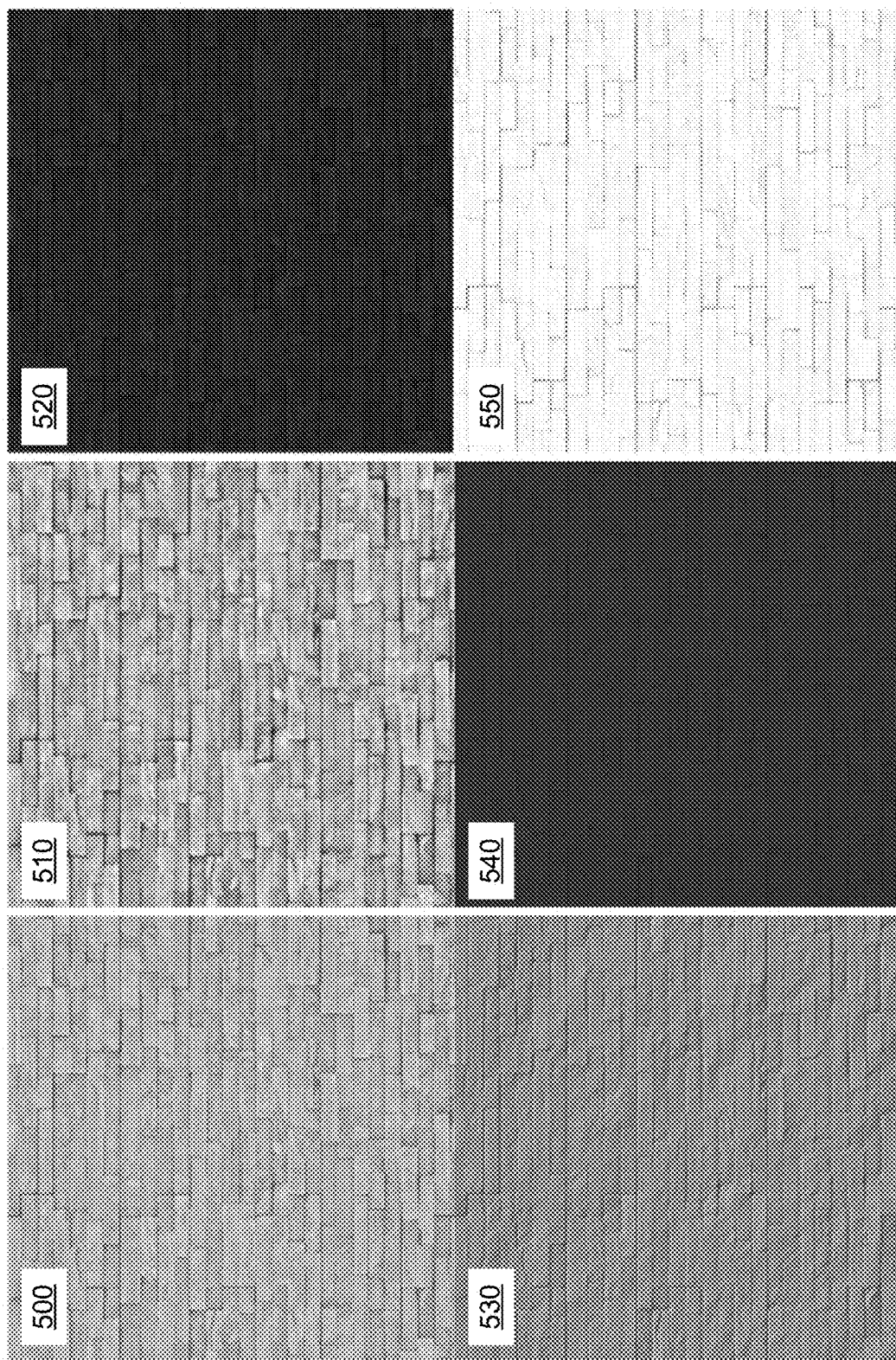
FIG. 5A illustrates an example material image and example texture maps, in accordance with some embodiments.

FIG. 5A illustrates an example material image and example texture maps, in accordance with some embodiments. The material image 500 is displayed along with an example displacement map 510, reflection map 520, normal map 530, gloss map 540, and ambient occlusion map 550.

The material estimation module 140 may store a set of texture map models in a database. Each texture map model may be trained to generate texture maps for a different material class. In some embodiments, a texture map model includes multiple machine-learning models that each generate a different texture map. For example, a texture map model may include a model that generates a metalness texture map and another model that generates a roughness texture map.

The material estimation module 140 generates 430 texture maps for the material image. In some embodiments, the texture map model generates texture maps for a material image based on a windowing process. The texture map model may generate each texture value in the texture map based on a set of pixels in the material image that surround the pixel in the material image that correspond to the texture value in the texture map. The set of pixels in the material image that are used to generate a texture value in a texture map may be based on a window of pixels in the material image. For example, the window may be a rectangular set of pixels with a predetermined width and height, or with a width and height that is based on the width and height of the material image. The window may be centered on the pixel in the material image that corresponds to the texture value to be generated in the texture map.

Figure 5B:
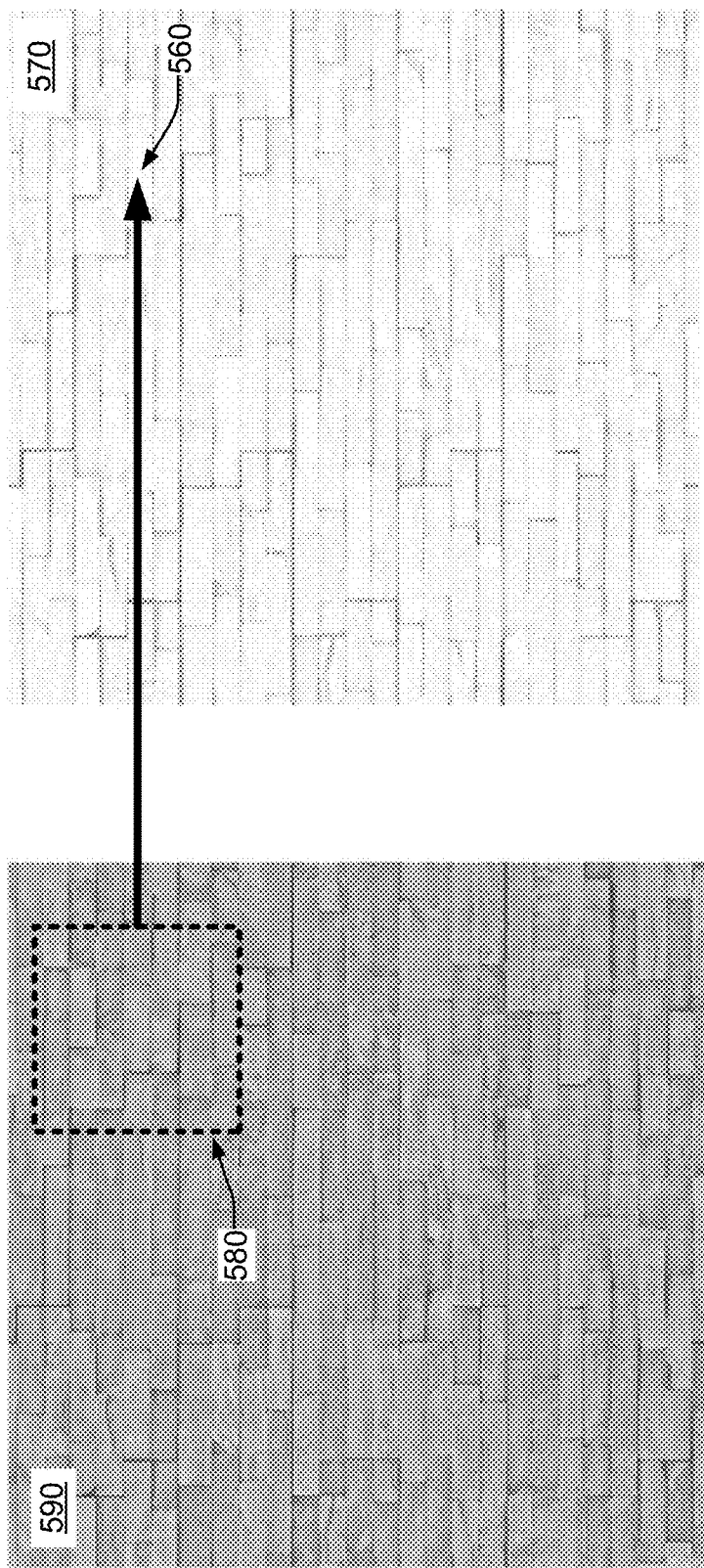
FIG. 5B illustrates an example windowing process for generating texture values for a texture map, in accordance with some embodiments.

FIG. 5B illustrates an example windowing process for generating texture values for a texture map, in accordance with some embodiments. To generate a pixel 560 in the texture map 570, the material estimation module 140 may apply a texture map model to a window 580 of pixels from the material image 590 that surround a corresponding pixel in the material image. The material estimation module 140 may iteratively generate the texture map 570 by repeatedly applying the texture map model to windows 580 corresponding to each pixel in the texture map 570.

In some embodiments, the material estimation module 140 determines whether the material image contains sufficient data to effectively generate texture maps based on the material image. For example, the material estimation module 140 may determine whether the material image meets a threshold resolution or size. If the material estimation module 140 determines that the material image does not contain sufficient data, the material estimation module 140 may apply texture expansion techniques to the material image to increase the amount of data that the material estimation module 140 can use to generate texture maps.

Example Model Assembly

FIG. 6 is a flowchart for a method of assembling an object model based on a set of part models, in accordance with some embodiments. Alternative embodiments may include more, fewer, or different steps from those illustrated in FIG. 6, and the steps may be performed in a different order from that illustrated in FIG. 6. Additionally, each of these steps may be performed automatically by the model generation system without human intervention. The method depicted in FIG. 6 may be performed by the model assembly module 150, or by some other component of the model generation system 120.

The model assembly module 150 may store pre-generated 3D part models of object parts. An object part is a defined part of an object. An object may have a set of parts associated with it, and each part may have different 3D models that represent different kinds of structures that those parts may have. For example, a chair object may have a "back" part and four "leg" parts, and a "leg" part may have many 3D models that represent different possible styles for the legs of a chair.

Each part model may be associated with model images of the part model. A model image of a part model is an image that is generated by rendering a 2D projection of the part model from a camera angle. Each part model may be associated with many different model images that were rendered from many different reference angles. For example, each part model may be associated with model images that are rendered from a top view, a bottom view, a side view, or a perspective view. The model images may be labeled with metadata indicating a camera view from which the rendered model image was rendered.

Figure 7A:
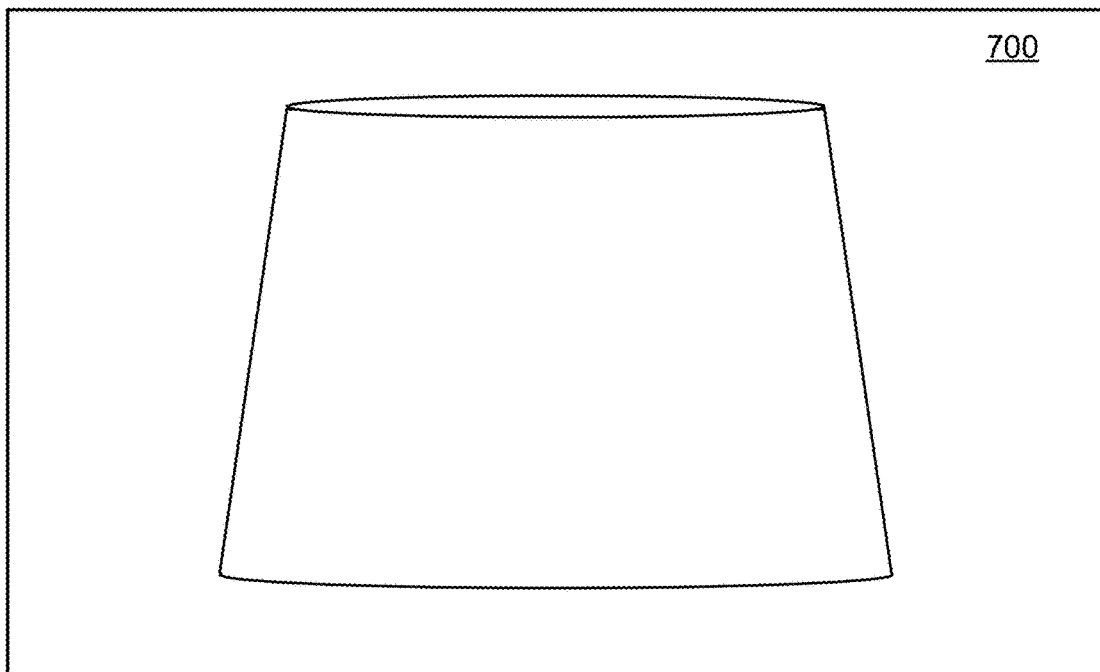
FIG. 7A illustrates example model images for a lamp shade part model, in accordance with some embodiments.
Figure 7A:
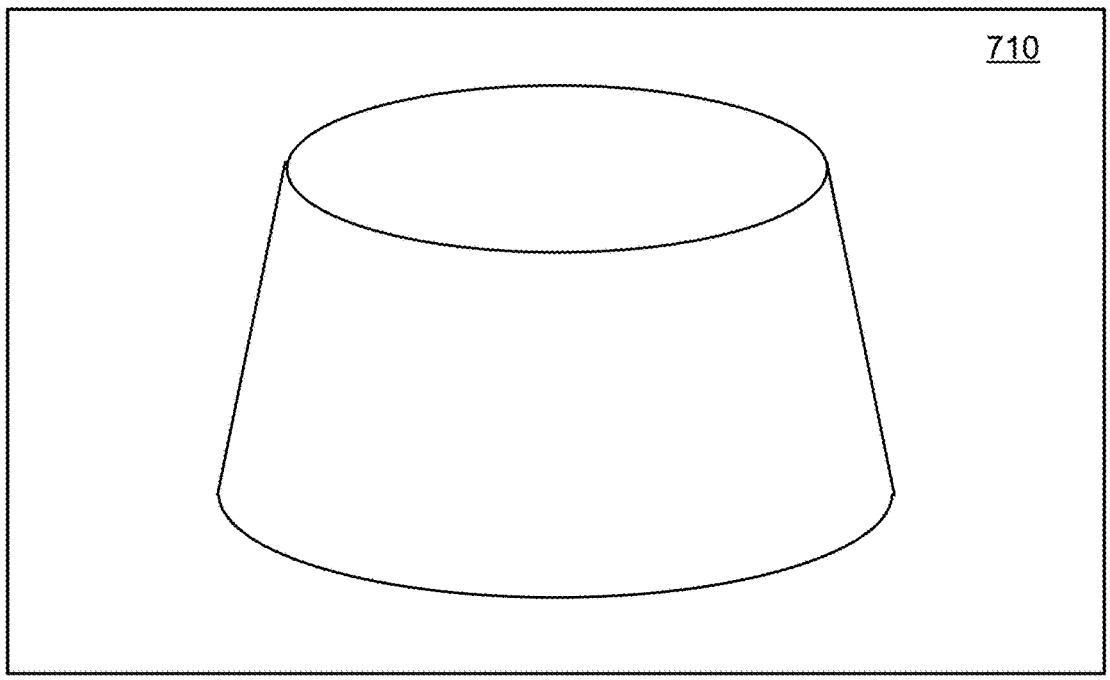

Referring to FIG. 7A, it illustrates example model images for a lamp shade part model, in accordance with some embodiments. One model image 700 is at a slight tilt from a straight look at the lamp shade and the other model image 710 is at a greater tilt. Other model images for the lamp shade part model may include a top-down view, a bottom-up view, or an untilted side view.

The model assembly module 150 may receive 600 a 2D image of an object and identify 610 the object parts of the object. For example, the model assembly module 150 may apply a semantic segmentation process to the object image to identify the object parts that make up the object.

Figure 7B:
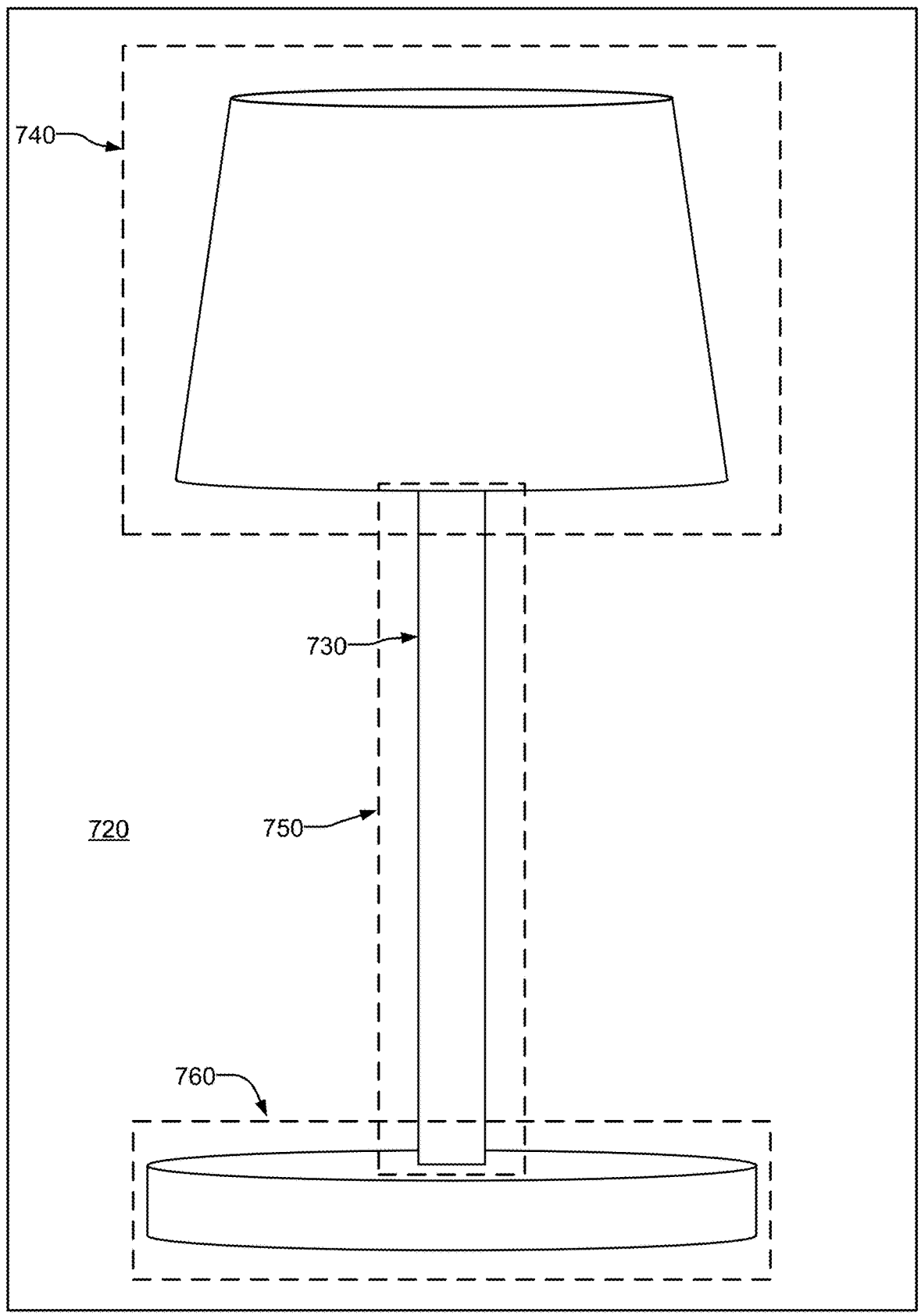
FIG. 7B illustrates an example object image that has been partitioned into separate parts, in accordance with some embodiments.

FIG. 7B illustrates an example object image 720 that has been partitioned into separate parts, in accordance with some embodiments. The object image 720 illustrated in FIG. 7B is of a lamp 730. The object itself may be pre-analyzed to classify the type of object. For example, the image may be analyzed to determine that this particular object is a lamp. Once the object is identified as a lamp, here, lamp 130, the model assembly module 150 may determine the parts that correspond to a lamp based on the matched classification and identify its parts as a lamp shade part 740, a lamp shaft part 750, and a lamp base part 760.

The model assembly module 150 may then determine whether it has stored a part model for an object part that the model assembly module 150 could use to represent the object part. Referring to FIG. 6, model assembly module 150 may identify 620 the type of the part. For example, if the object image is an image of a chair, the model assembly module 150 may first classify the object image as a chair. Using this classification, the model assembly module 150 may identify parts that correspond to a chair. More specifically, the model assembly module 150 may identify which parts correspond to a leg of the chair and which part corresponds to a seat of the chair. The model assembly module 150 may identify the type of the part by applying a machine-learning model that is trained to identify a part type based on the object image. For example, the model assembly module 150 may apply a classifier to the object image to identify the part types of the parts of the object.

The model assembly module 150 may generate 630 similarity scores for the part model for parts stored by the model assembly module 150 to determine whether a stored part model could serve as a model for the object part. To score a part model, the model assembly module 150 may compare the portion of the object image that corresponds to the object part to the rendered reference images of the part model. The model assembly module 150 may generate an image similarity score between the portion of the 2D image that corresponds to the object part and each model image. For example, the model assembly module 150 may apply a machine-learning model (e.g., a neural network) that is trained to generate an image similarity score that represents the similarity between the portion of the object image that corresponds to the object part and the model images for a part model. The model assembly module 150 may generate a similarity score for the part model based on the image similarity scores generated for the part model's model images. For example, the model assembly module 150 may score the part model based on the highest image similarity score of the part model's model images. The model assembly module 150 may use the highest image similarity score because model images with lower similarity scores may simply be rendered from a view different from the view of the object image of the object, rather than because the part model is not similar to the object part. Thus, even with a highly accurate match between the part model and the object part, only one of the model images will have a high similarity score. In some embodiments, however, the model assembly module 150 may score the part model based on an average of the image similarity scores of its model images or some other aggregation of the similarity scores.

The model assembly module 150 identifies 640 a part model for the object part based on the part model scores. For example, the model assembly module 150 may identify the part model with the highest part model score as a part model to represent the part. In some embodiments, the model assembly module 150 applies a part score threshold to the identified part model to ensure at least some threshold similarity between the object part and the part model. If the identified part model has a part model score that exceeds the threshold, the model assembly module 150 may use the identified part model for the object part. If the part model score for the part model does not exceed the threshold, the model assembly module 150 may determine that it does not have stored a part model that is sufficiently similar to the object part to be used in the model of the object. The model assembly module 150 may generate a part model for the object part based on the object image of the object (e.g., using the process described in FIG. 2).

The model assembly module 150 generates 650 an object model of the object based on the part models identified for each object part of the object. The model assembly module 150 may generate the object model for the object by aligning each part model with an appropriate location based on the type of the object. For example, for a lamp object, the model assembly module 150 may position a lamp shade part model above a shaft part model and a base part model. In some embodiments, the model assembly module 150 applies a pre-determined assembly process to generate an object model based on part models. For example, the model assembly module 150 may use an assembly graph that indicates the relative positions of object parts that make up an object.

Example Modeling from CAD Data

FIG. 8 is a flowchart for a method of generating 3D models of an object based on computer aided design (CAD) data, in accordance with some embodiments. Alternative embodiments may include more, fewer, or different steps from those illustrated in FIG. 8, and the steps may be performed in a different order from that illustrated in FIG. 8. Additionally, each of these steps may be performed automatically by the model generation system without human intervention. The method depicted in FIG. 8 may be performed by the CAD conversion module 160, or by some other component of the model generation system 120.

The CAD conversion module 160 receives 800 computer-assisted design (CAD) data describing an object. The CAD data may describe surfaces of the object that make up the object. For example, for a cube object, the CAD data may describe each of the six surfaces of the cube. The CAD data may describe the surfaces through equations for each surface that parameterize the surfaces. The CAD conversion module 160 may extract 810 the surfaces from the CAD data to generate a 3D model of the object based on the CAD data. For example, the CAD conversion module 160 may extract the equations describing the shape of the surfaces from the CAD data. In some embodiments, to extract the equations describing the shape of the surfaces from the CAD data, the CAD conversion module 160 identifies the lowest level surface modeled by a Non-Uniform Rational B-Splines (NURBS) formula that maps two-dimensional values to a three-dimensional space.

To generate a 3D model of the object, the CAD conversion module 160 generates 820 field lines for the surface. Field lines are lines that are tangent to the gradient vector field of the surface. The gradient vector field of a surface is the vector field representing the gradient over the surface. The CAD conversion module 160 may generate a gradient vector field for the surface to generate a set of field lines for the surface. The number of field lines that the CAD conversion module 160 generates for the surface may be based on a target number of tessellations for the surface in the eventual 3D model of the surface, a surface area of the surface, the magnitudes of the gradient vectors in the gradient vector field, or the directions of the gradient vectors in the gradient vector field. In some embodiments, the CAD conversion module 160 generates a set of field lines for each surface such that the field lines of surfaces whose edges touch line up. The CAD conversion module 160 thereby ensures that the vertices of the eventual tessellations overlap appropriately in the eventual 3D model.

The CAD conversion module 160 generates 830 equipotential lines for the surface. Equipotential lines are lines along the surface that designate points that have the same potential within the gradient vector field. The CAD conversion module 160 may generate a set of equipotential lines along the surface. The number of equipotential lines that the CAD conversion module 160 generates for the surface may be based on a target number of tessellations for the surface in the eventual 3D model of the surface, a surface area of the surface, the magnitudes of the gradient vectors in the gradient vector field, or the directions of the gradient vectors in the gradient vector field.

The CAD conversion module 160 may generate field lines or the equipotential lines based on the LaPlace equation. For example, the CAD conversion module 160 may compute the field lines or the equipotential lines by analogizing the gradient vector field to an electric field generated by a positive point charge at some point on the surface and a uniform negative charge distributed across the edge of the surface. The CAD conversion module 160 may use the LaPlace equation to generate the field lines and the equipotential lines by applying the LaPlace equation to the surface equations that define the surface.

Figure 9A:
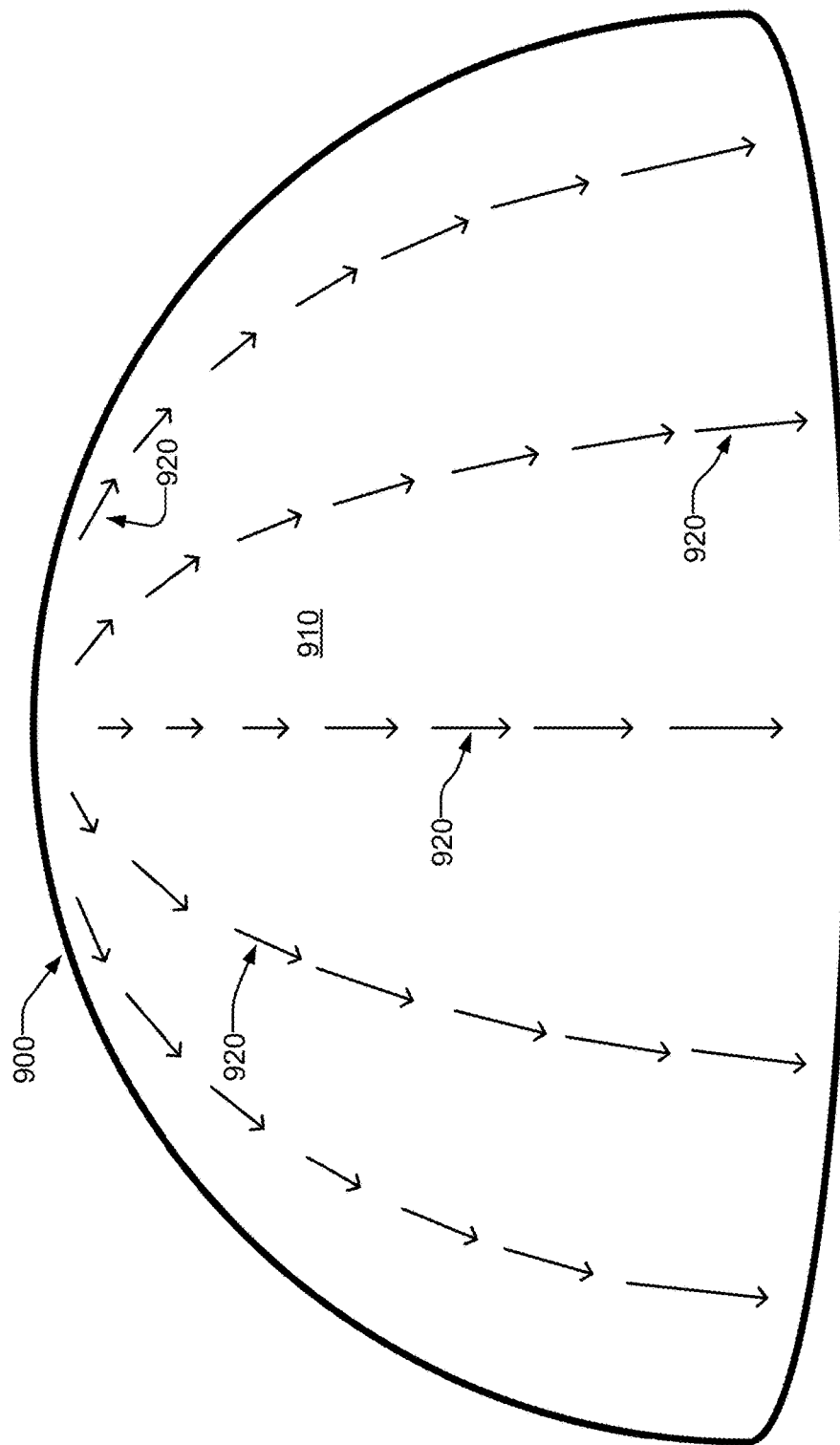
FIG. 9A illustrates an example hemispherical surface with vector lines representing an example gradient vector field, in accordance with some embodiments.

FIG. 9A illustrates an example hemispherical surface with vector lines representing an example gradient vector field, in accordance with some embodiments. The surface 900 illustrated in FIG. 9A may be defined based on a surface equation that is based on a three-dimensional equation for a sphere for some range of x, y, and z coordinates. The CAD conversion module 160 may use the surface equation for the surface 900 to generate a gradient vector field 910. For example, the CAD conversion module 160 may generate the gradient 920 of the surface equation at a set of points on the surface and may generate the gradient vector field based on the gradients 920 at those sets of points.

Figure 9B:
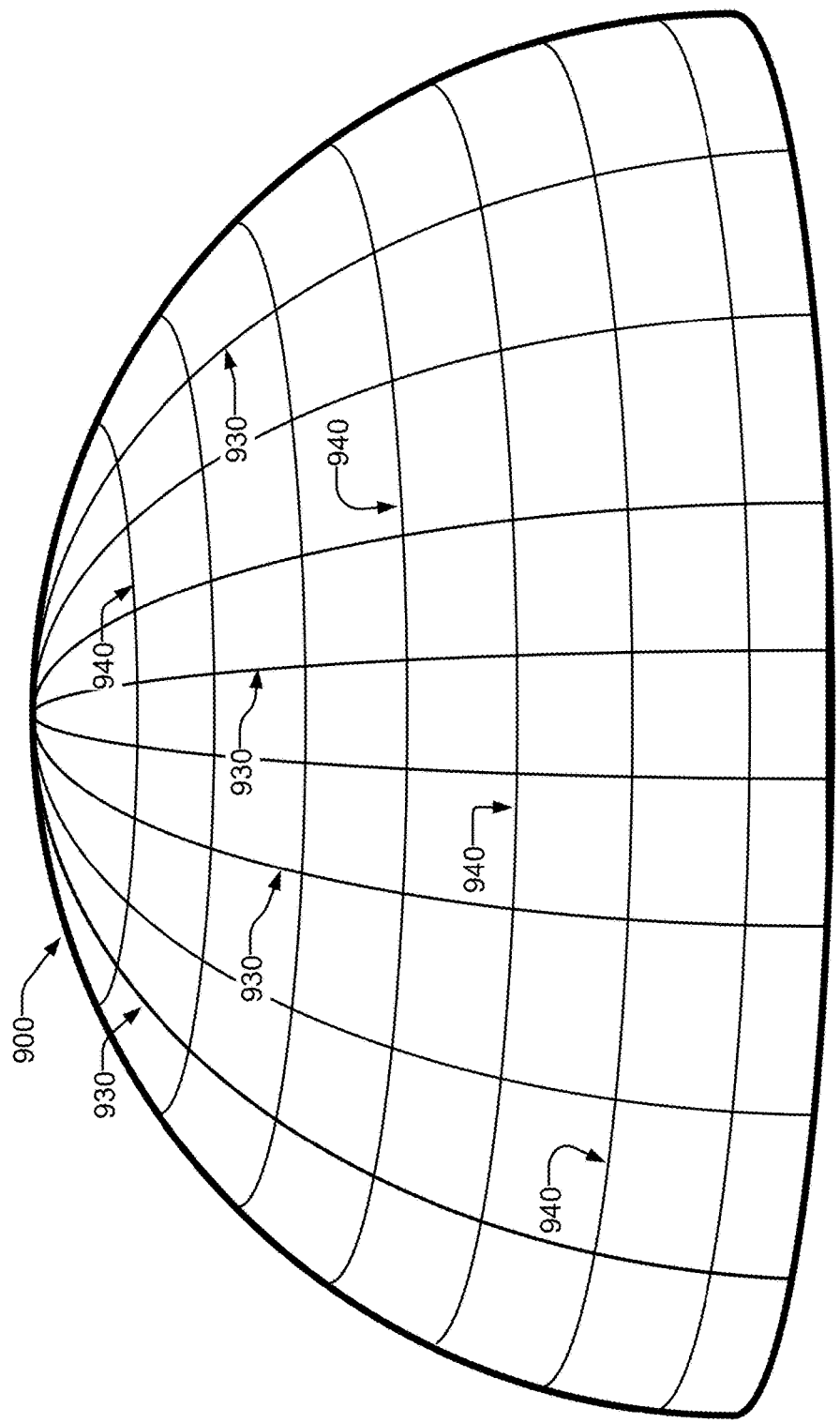
FIG. 9B illustrates an example hemispherical surface with field lines and equipotential lines, in accordance with some embodiments.

FIG. 9B illustrates an example hemispherical surface with field lines and equipotential lines, in accordance with some embodiments. The CAD conversion module 160 may use the surface equation for the surface or the gradient vector field to generate field lines 930 and equipotential lines 940 for the hemispherical surface.

The CAD conversion module 160 generates 840 a tessellated model of the object based on the CAD data, the field lines 930, and the equipotential lines 940. The tessellated model of the object may include a set of quadrangular tessellations that, together, estimate the structure of the object. The CAD conversion module 160 may generate the tessellations for the tessellated model by using points along the field lines 930 and the equipotential lines 940 to generate edges for the tessellations. For example, the CAD conversion module 160 may select a set of points along each equipotential line 940 and a set of points along each field line and may use edges between the selected points to generate tessellations. In some embodiments, the CAD conversion module 160 uses points where a field line, e.g., 930, intersects 950 with an equipotential line, e.g., 940, as the vertices that make up the tessellations. The CAD conversion module 160 may generate edges between those vertices to generate the tessellations.

In some embodiments, the CAD conversion module 160 applies 850 a texture to the tessellated model. The CAD conversion module 160 may apply the texture to the tessellated model based on a 2D mapping of the surface stored in the CAD data. For example, the CAD data may store a mapping of points in two dimensions to points on the surface. The CAD conversion module 160 may then use the 2D mapping to apply a 2D texture map to the surface. For example, the CAD conversion module 160 may use the 2D mapping of the surface to map values in the 2D texture map to the surface.

In some embodiments, the CAD conversion module 160 determines the corresponding 2D coordinate in the 2D mapping for a new vertex that is added to the tessellated model. For example, new 3D vertices may be added to the tessellated model when the tessellations are sub-divided into new, smaller tessellations. These new vertices may not be covered by the 2D mapping. To determine a 2D coordinate in the 2D texture map for a new 3D vertex, the CAD conversion module 160 may apply gradient descent from a pre-existing vertex in the tessellated model for which the CAD conversion module 160 already has a corresponding 2D coordinate to the new vertex to determine the 2D coordinate that corresponds to the new vertex.

Additional Considerations

By generating 3D models for objects based on 2D images, the model generation system improves on conventional technologies for generating 3D models for objects by reducing the time and cost required. Specifically, the model generation system may generate a 3D model of an object based on images of the object that are easy to capture, without specialized equipment or significant manual labor.

By generating texture maps based on a color image, the model generation system improves on conventional technologies for generating texture maps by reducing the time and cost required. Specifically, the model generation system is capable of generating a set of texture maps for a physical material without significant manual labor.

The model generation system improves on conventional model generation technologies by reusing previously generated part models for a new part corresponding to an object, thereby allowing high-quality 3D models to be reused more easily. Additionally, the model generation system more effectively identifies part models that can be used to represent a part of an object by using rendered model images from different perspectives, thereby ensuring that a match for the part can be more easily identified.

The model generation system improves on conventional technologies through the use of heretofore unused information in CAD data for the effective generation of 3D models of objects and to apply a texture to the 3D model more effectively and efficiently. Additionally, by generating field lines and equipotential lines to use in the generation of a tessellated model, the model generation system can generate quadrangular tessellations that have edges that do not intersect while following the contours and edges of the surface itself, and have angles that are closer to right angles. These properties improve the overall quality of the tessellated 3D model.

The foregoing description of the embodiments has been presented for the purpose of illustration; it is not intended to be exhaustive or to limit the patent rights to the precise pages disclosed. Persons skilled in the relevant art can appreciate that many modifications and variations are possible in light of the above disclosure.

Some portions of this description describe the embodiments in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In some embodiments, a software module is implemented with a computer program product comprising one or more computer-readable media containing computer program code or instructions, which can be executed by a computer processor for performing any or all of the steps, operations, or processes described. In some embodiments, a computer-readable medium comprises one or more computer-readable media that, individually or together, comprise instructions that, when executed by one or more processors, cause the one or more processors to perform, individually or together, the steps of the instructions stored on the one or more computer-readable media. Similarly, a processor comprises one or more processors or processing units that, individually or together, perform the steps of instructions stored on a computer-readable medium.

Embodiments may also relate to an apparatus for performing the operations herein. This apparatus may be specially constructed for the required purposes, or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments may also relate to a product that is produced by a computing process described herein. Such a product may comprise information resulting from a computing process, where the information is stored on a non-transitory, tangible computer readable storage medium and may include any embodiment of a computer program product or other data combination described herein.

The description herein may describe processes and systems that use machine-learning models in the performance of their described functionalities. A "machine-learning model," as used herein, comprises one or more machine-learning models that perform the described functionality. Machine-learning models may be stored on one or more computer-readable media with a set of weights. These weights are parameters used by the machine-learning model to transform input data received by the model into output data. The weights may be generated through a training process, whereby the machine-learning model is trained based on a set of training examples and labels associated with the training examples. The weights may be stored on one or more computer-readable media, and are used by a system when applying the machine-learning model to new data.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

As used herein, the terms "comprises," "comprising," "includes," "including," "has," "having," or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive "or" and not to an exclusive "or". For example, a condition "A or B" is satisfied by any one of the following: A is true (or present) and B is false (or not present), A is false (or not present) and B is true (or present), and both A and B are true (or present). Similarly, a condition "A, B, or C" is satisfied by any combination of A, B, and C having at least one element in the combination that is true (or present). As a not-limiting example, the condition "A, B, or C" is satisfied by A and B are true (or present) and C is false (or not present). Similarly, as another not-limiting example, the condition "A, B, or C" is satisfied by A is true (or present) and B and C are false (or not present).

What is claimed is:

1. A method comprising:
    receiving, at a model generation system, an object image depicting an object;
    identifying a set of parts of the object based on the object image;
    for each part in the set of parts:
        identifying a part type for the part, the part type being one of a set of part types associated with the object;
        accessing a plurality of candidate part models associated with the identified part type, wherein each part model of the plurality of candidate part models is a three-dimensional model of an object part of the identified part type;
        generating a similarity score for each part model of a plurality of candidate part models stored by the model generation system, wherein the similarity score for a part model is generated by:
            accessing a plurality of model images associated with the part model; and comparing the object image to each of the plurality of model images; and selecting a part model for the part based on the similarity score of each part model of the plurality of candidate part models; and generating a three-dimensional (3D) object model for the object based on an identified part model for each part in the set of parts.

2. The method of claim 1, wherein the set of parts of the object are identified by applying a semantic segmentation process to the object image.

3. The method of claim 1, wherein the part type for the part is identified based on an object type for the object.

4. The method of claim 1, wherein generating a similarity score for each part model of the plurality of part models comprises generating an image similarity score for each model image of the set of model images associated with the part model based on the comparing of the object image to each of the plurality of model images, an image similarity score for a model image representing a similarity of the model image to the object image.

5. The method of claim 4, wherein the similarity score for a part model of the plurality of part models is generated based on a highest image similarity score for a model image of the set of model images associated with the part model.

6. The method of claim 1, wherein each model image in the set of model images associated with the part model is a rendered image of the part model.

7. The method of claim 6, wherein each model image in the set of model images associated with the part model is rendered based on a camera view of a set of camera views.

8. The method of claim 1, wherein the similarity score for a part model is generated based on a portion of the object image associated with a part.

9. The method of claim 1, wherein a part model for the part is identified responsive to the similarity score for the part model exceeding a threshold.

10. The method of claim 9, further comprising: responsive to no part model of the plurality of part models having a similarity score that exceeds the threshold, generating a new part model for the part based on the object image.

11. A non-transitory, computer-readable medium comprising stored instructions, the instructions when executed by a processor, cause the processor to:

receive, at a model generation system, an object image depicting an object;

identify a set of parts of the object based on the object image;

for each part in the set of parts:

identify a part type for the part, the part type being one of a set of part types associated with the object;

access a plurality of candidate part models associated with the identified part type, wherein each part model of the plurality of candidate part models is a three-dimensional model of an object part of the identified part type;

generate a similarity score for each part model of a plurality of candidate part models stored by the model generation system, wherein the similarity score for a part model is generated by:

accessing a plurality of model images associated with the part model; and comparing the object image to each of the plurality of model images; and select a part model for the part based on the similarity score of each part model of the plurality of candidate part models; and generate a three-dimensional (3D) object model for the object based on an identified part model for each part in the set of parts.

12. The computer-readable medium of claim 11, further comprising instructions that when executed by the processor cause the processor to identify the set of parts of the object by applying a semantic segmentation process to the object image.

13. The computer-readable medium of claim 11, wherein the part type for the part is identified based on an object type for the object.

14. The computer-readable medium of claim 11, further comprising instructions that when executed by the processor cause the processor to generate a similarity score for each part model of the plurality of part models comprises by generating an image similarity score for each model image of the set of model images associated with the part model based on the comparing of the object image to each of the plurality of model images, an image similarity score for a model image representing a similarity of the model image to the object image.

15. The computer-readable medium of claim 14, wherein the instructions to generate a similarity score for a part model of the plurality of part models further comprise instructions that when executed cause the processor to generate the similarity score based on a highest image similarity score for a model image of the set of model images associated with the part model.

16. The computer-readable medium of claim 11, further comprising instructions that when executed cause the processor, for each model image in the set of model images associated with the part model, to render an image of the part model.

17. The computer-readable medium of claim 16, further comprising instructions that when executed cause the processor, for each model image in the set of model images associated with the part model, to render based on a camera view of a set of camera views.

18. The computer-readable medium of claim 11, wherein the instructions to generate the similarity score for a part model further comprise instructions to generate the similarity score based on a portion of the object image associated with a part.

19. The computer-readable medium of claim 11, wherein the instructions to identify the part model for the part further comprise instructions that when executed causes the processor to identify the part model of a part when the similarity score for the part model exceeds a threshold.

20. The computer-readable medium of claim 19, further comprising instructions that when executed cause the processor to generate a new part model for the part model based on the object image when no part model of the plurality of part models have a similarity score that exceeds the threshold.

* * * * *